(12) United States Patent
Reber et al.

(10) Patent No.: US 7,713,848 B2
(45) Date of Patent: May 11, 2010

(54) METHOD FOR RE-CRYSTALLIZATION OF LAYER STRUCTURES BY MEANS OF ZONE MELTING, A DEVICE FOR THIS PURPOSE AND USE THEREOF

(75) Inventors: Stefan Reber, Gundelfingen (DE); Achim Eyer, Freiburg (DE); Fridolin Haas, Kirchzarten (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 52 days.

(21) Appl. No.: 12/065,742

(22) PCT Filed: Sep. 4, 2006

(86) PCT No.: PCT/EP2006/008611
§ 371 (c)(1),
(2), (4) Date: Jun. 18, 2008

(87) PCT Pub. No.: WO2007/031209
PCT Pub. Date: Mar. 22, 2007

(65) Prior Publication Data
US 2008/0268566 A1   Oct. 30, 2008

(30) Foreign Application Priority Data
Sep. 12, 2005   (DE) .................. 10 2005 043 303

(51) Int. Cl.
*H01L 21/20* (2006.01)
(52) U.S. Cl. .................. 438/478; 117/3; 117/10; 438/479; 438/486; 438/57; 438/97
(58) Field of Classification Search ......... 438/478–509, 438/96, 97; 117/3, 10
See application file for complete search history.

(56) References Cited

U.S. PATENT DOCUMENTS

| 4,578,144 A | | 3/1986 | Hiramoto |
| 5,741,359 A | * | 4/1998 | Motoda et al. ................. 117/43 |
| 2005/0272185 A1 | * | 12/2005 | Seki et al. .................. 438/149 |
| 2005/0282364 A1 | * | 12/2005 | Seki et al. .................. 438/479 |

FOREIGN PATENT DOCUMENTS

| JP | 60191092 A | 9/1985 |
| WO | 8912317 A | 12/1989 |
| WO | 2004-023538 A | 3/2004 |

OTHER PUBLICATIONS

International Search Report for International Application PCT/EP2006/008611.
Written Opinion for International Application PCT/EP2006/008611.
International Preliminary Report on Patentability and Written Opinionfor International Application PCT/EP2006/008611.

* cited by examiner

*Primary Examiner*—Savitri Mulpuri
(74) *Attorney, Agent, or Firm*—Matthew B. Dernier, Esq.; Gibson & Dernier LLP

(57) ABSTRACT

The invention relates to a method for re-crystallization of layer structures by means of zone melting, in which, as a result of convenient arrangement of a plurality of heat sources, a significant acceleration of the zone melting method can be achieved. The method is based on the fact that a continuous recrystallisation of the layer is ensured as a result of overlaps being produced. According to the invention, a device is likewise provided with which the method according to the invention can be achieved. The method according to the invention is used in particular in the production of crystalline silicon thin layer solar cells or for example in SOI technology. However the application likewise relates also in general to the processing of metals, plastic materials or adhesives and here in particular to the production of thin layers.

16 Claims, 4 Drawing Sheets

METHOD FOR RE-CRYSTALLIZATION OF LAYER STRUCTURES BY MEANS OF ZONE MELTING, A DEVICE FOR THIS PURPOSE AND USE THEREOF

BACKGROUND

The invention relates to a method for recrystallization of layer structures by means of zone melting, in which, as a result of convenient arrangement of a plurality of heat sources, a significant acceleration of the zone melting method can be achieved. The method is based on the fact that a continuous recrystallisation of the layer is ensured as a result of overlaps being produced. According to the invention, a device is likewise provided with which the method according to the invention can be achieved. The method according to the invention is used in particular in the production of crystalline silicon thin layer solar cells or for example in SOI technology. However the application likewise relates also in general to the processing of metals, plastic materials or adhesives and here in particular to the production of thin layers.

The production of thin doped semiconductor layers for electronics and photovoltaics is at present implemented in the most varied of ways. In general, the aim is to produce sandwich-like layer structures comprising differently doped partial layers. Typically, a plurality of process steps is thereby used which construct the layer structures sequentially. For solar cells made of crystalline silicon, the crystal structure is of fundamental importance for the degree of effectiveness which can be achieved. The fewer the defects in the crystal, the simpler is the production of highly efficient solar cells.

The state of the art in the field of semiconductor structures are methods in which the semiconductor is recrystallised after a deposition step again via the liquid phase in order to change for example the crystal structure. Such an application is provided for example in "Silicon on Insulator" (SOI) Technology or also in the field of crystalline silicon thin layer solar cells.

Crystalline silicon thin layer solar cells are being researched at present in different concepts. One of these concepts is represented by way of example in FIG. 1. For the production of a solar cell represented in FIG. 1, the manufacturing steps represented in FIG. 2 are required. The method step for recrystallisation of the layer via the liquid phase, represented in FIG. 2, can be implemented by means of various methods. One of these methods is zone melting (zone melting recrystallisation, ZMR). The nucleus layer represented in FIG. 1 is heated by a linear or linearly scanned heat source such that it melts linearly over the entire width of the substrate. This molten line, i.e. the melting zone, is drawn by a relative movement of substrate and heat source in the direction perpendicular to the melting zone in the substrate plane through the entire substrate length.

As a function of the drawing speed and the temperature gradient at the melting zone limits, crystals are produced which are extended in the drawing direction and have different dimensions. It is a typical aim of each zone melting process to produce crystals which are as large and as low in defects as possible. However in the case of using a zone melting process for photovoltaics, this aim runs counter to economical target specifications for a cost-effective process. From the point of view of economics, the throughput must be as high as possible, i.e. at least 0.1 m$^2$/min, the high crystal quality which is possible at moderate drawing speeds being intended to be maintained simultaneously.

SUMMARY OF THE INVENTION

Starting herefrom, it was the object of the present invention to provide a zone melting method in which the throughput of the zone melting method is decoupled from the drawing speed and hence high crystal qualities are made possible with a simultaneously high throughput.

According to the invention, a method for recrystallisation of layer structures by means of zone melting is provided, in which the melting zones produced linearly with at least two heat sources are drawn through the layer by means of a relative movement of the heat sources relative to the layer in a direction perpendicular to the linear melting zones. The melting zones are thereby drawn simultaneously through the entire layer with an overlap in regions of the melting zones with already recrystallised melting zones so that a continuous recrystallisation of the layer is made possible.

It is desirable that a plurality of heat sources are connected one behind the other or next to each other but, by means of skilled control of the heat energy coupled into the melting zones per unit of time, alternation between optimum zone melting and rapid transport is effected without loss of the gained crystal quality. This alternation makes it possible to achieve the object according to the invention.

Preferably, the relative movement is made possible by transport of the layer. Another preferred variant provides that the relative movement of the heat sources relative to the layer is achieved by transport of the heat sources. However it is likewise possible that transport both of the layer and the heat sources is effected.

Preferably, the method is implemented such that the melting zones, in the direction perpendicular to the linear melting zones, overlap in regions with already recrystallised melting zones. For this purpose, it is necessary that the at least two heat sources, in the direction perpendicular to the linear melting zones, are disposed one behind the other, the spacing between adjacent heat sources being of equal size. This leads to the fact that an arbitrary number of melting zones are established one behind the other in cascade form.

Basically, the method according to the invention can be subdivided into a melting phase and into a transport phase. During the melting phase, the relative movement between layer and heat source is effected precisely at such a speed that an optimum melt zone formation and recrystallisation is achieved. During the transport phase, the speed is increased and the coupled power of the heat sources is preferably reduced so that the melting zone breaks down, i.e. either is no longer present or no longer entirely present. It is desirable that the layer no longer melts in its entire cross-section so that an existing crystal structure is not destroyed by the melting zone. The combination of the mentioned phases leads to the fact that, in the melting phase, a stretch which is prescribed in any manner by the number and arrangement of the heat sources is remelted with a high resulting crystal quality and subsequently, in the transport phase, this stretch is skipped over apart from a small overlap without the high crystal quality achieved in the melting phase being destroyed. Since the transport phase is passed through at a much higher feed rate than the melting phase, there is a substantially higher throughput of the device according to the invention than when using a melt heater, as is known from prior art.

Three variants are preferred with respect to implementation of the method.

According to a first preferred variant, in a first phase, i.e. the melting phase, the at least three melting zones, in the direction perpendicular to the linear melting zones, are drawn through the layer over a stretch d+a. The relative movement of the melting zones is thereby effected simultaneously. The speed is thereby chosen such that a high crystal quality is made possible. The stretch d hereby corresponds to the spacing of two adjacent heat sources. The stretch a which is responsible for the overlap is chosen such that the latter is smaller than d, it being preferred that the ratio of a to d is in the range of 1:4 to 1:100.

Subsequently, in a second phase, i.e. the transport phase, transport of the layer is effected over a second stretch which is subsequent to the first stretch in the direction perpendicular to the linear melting zones. This second stretch thereby has a length of $(n-1) \cdot d - b$, n representing the number of successively disposed heat sources and b being chosen such that the result is an overlap of the melting zones with the already recrystallised zones. In the transport phase, the speed is increased, as a result of which the layer recrystallised in the melting phase is not melted. The melting phase and the transport phase are repeated until a continuous recrystallisation of the layer is achieved.

This first variant is hence based on the fact that the layer is transported whilst the heat sources are stationary.

A second variant according to the invention provides that, in a first phase, i.e. the melting phase, the at least two heat sources, in the direction perpendicular to the linear melting zones, are moved simultaneously over a first stretch d+a, d representing the spacing of two adjacent heat sources and a being smaller than d. Here also, it is again preferred that a is substantially smaller than d, e.g. in the range of 1:4 to 1:100 since the smaller the stretch a is chosen to be, the smaller is the overlap and hence the throughput is increased. In the melting phase, the speed is chosen to be so low that a high crystal quality is made possible.

In the transport phase, the at least two heat sources are subsequently moved back over a stretch $-(d+a)$, i.e. the heat source is transported back to its initial point. Subsequently, the layer is then moved over a stretch $n*d+a-b$ in the opposite direction thereto, the speed being increased in comparison to the speed in the melting phase in order to prevent melting of the layer. Here also, n means the number of successively disposed heat sources and b is chosen such that the result is an overlap of the melting zones with the already recrystallised zones. The transport of the layer can be moved thereby likewise also in the same direction as the direction of movement of the melting zone. However transport in the opposite direction to the melting phase offers the advantage that the new start cycle starts from an already recrystallised overlapping region of the previous cycle.

The melting phase and the transport phase are implemented alternately until the continuous recrystallisation of the layer is achieved. In the second preferred variant described here, both the heat sources and the layer are hence transported.

A third preferred variant of the method according to the invention provides that, in a first melting phase, the at least two melting zones, in the direction perpendicular to the linear melting zones, are drawn over a first stretch $-(d+a)$ simultaneously, the speed being chosen such that a high crystal quality is made possible. The stretches d and a have the previously described meaning.

In a second phase, i.e. the transport phase, the at least two heat sources and/or the layer are moved over a second stretch $n*d+a-b$ which is subsequent to the first stretch in the direction perpendicular to the linear melting zones, the speed being increased relative to the first melting phase so that the layer cannot be melted. N means here the number of successively disposed heat sources and b is chosen such that the result is an overlap of the melting zones with the already re-crystallized melting zones.

In further phase, the second melting phase, the at least two melting zones, in the direction perpendicular to the linear melting zones, are then drawn over a stretch $-(d+a)$ simultaneously, the speed being chosen such that a high crystal quality is made possible. The stretches d and a have the previously described meaning.

In a fourth phase, in the second transport phase, again the at least two heat sources and/or the layer are moved over a second stretch $n*d+a-b$ which is subsequent to the first stretch in the direction perpendicular to the linear melting zones. Here also, again the speed is increased relative to the melting phases. The mentioned variables have the previously described meaning and are chosen such that here also an overlap of the melting zones with the already recrystallised melting zones is again made possible.

The previously mentioned three method steps are repeated until a continuous recrystallisation of the layer is achieved. In the third preferred method variant described here, both the heat sources and the layer are hence moved.

The temperature of the heat sources is preferably reduced in the transport phase.

Preferably, the movement of the heat sources and/or of the layer, i.e. the relative movement between both, is effected in the transport phase at a speed which is higher by a factor in the range of 2 to 100 than in the melting phase. This factor is thereby greatly dependent upon the number of melting zones and hence the heat sources. Hence, e.g. with 10 heat sources, a factor 2 is already very effective, whilst a factor of 10 or more should be chosen in the case of only two heat sources.

A further preferred alternative of the method according to the invention provides that the at least two heat sources, in the direction perpendicular to the linear melting zones, are disposed adjacently, the adjacently disposed heat sources having an offset relative to each other respectively in the direction perpendicular to the linear melting zones. This makes it possible that the melting zones produced by the heat sources can overlap in regions in the direction perpendicular to the linear melting zones. It is ensured by an overlap of the individual melting rows that the complete surface of the layer is recrystallised continuously. Also in this alternative according to the invention, the individual heat sources can be distributed arbitrarily but equidistant on the front and/or rear side.

The heat sources are preferably selected independently of each other from the group comprising electron beam heaters, laser beam sources, graphite strip heaters, halogen lamp heaters, IR radiators and UV radiators. All the previously mentioned heat sources can also be combined with each other.

Preferably, the layer to be recrystallised is connected to a substrate. With respect to the connection between the layer and the substrate, all variants known from prior art are possible.

With respect to the arrangement of the heat sources, no restriction exists so that these can be disposed independently of each other on the front side and/or rear side towards the surface of the layer and/or of the substrate.

According to the invention, a device for recrystallisation of layer structures by means of zone melting with at least two linear heat sources is likewise provided. Melting zones are produced in a layer by the heat sources, the heat sources being disposed and moveable such that the melting zones overlap in regions with already recrystallised zones and thus a continuous recrystallisation of the layer is ensured.

In a preferred variant, the heat sources, in the direction perpendicular to the linear melt zones, are disposed adjacently, the adjacently disposed heat sources having an offset relative to each other respectively in the direction perpendicular to the linear melting zones so that the melting zones produced by the heat sources overlap in regions.

Another preferred variant provides that at least four heat sources are disposed in an array with respect to the semiconductor layer, the adjacently disposed heat sources having an offset relative to each other respectively in the direction perpendicular to the linear melting zones so that the melting zones produced by the heat sources overlap in regions.

Preferably, the heat sources are selected independently of each other from the group comprising electron beam heaters, laser beam sources, graphite strip heaters, halogen lamp heaters, IR radiators and UV radiators. These can also be combined with each other in any manner.

A further preferred variant of the device according to the invention provides that the heat sources are provided with focusing mirrors.

According to the invention, the described method is used for the production of crystalline silicon thin layer solar cells or in SOI technology. Separately therefrom, the method can however also be used in general for processing metals, plastic materials or adhesives.

BRIEF DESCRIPTION OF THE DRAWING

The subject according to the invention is intended to be explained in more detail with reference to the following Figures without wishing to restrict said subject to the special embodiments shown here.

DETAILED DESCRIPTION OF THE INVENTION

Figure 1:
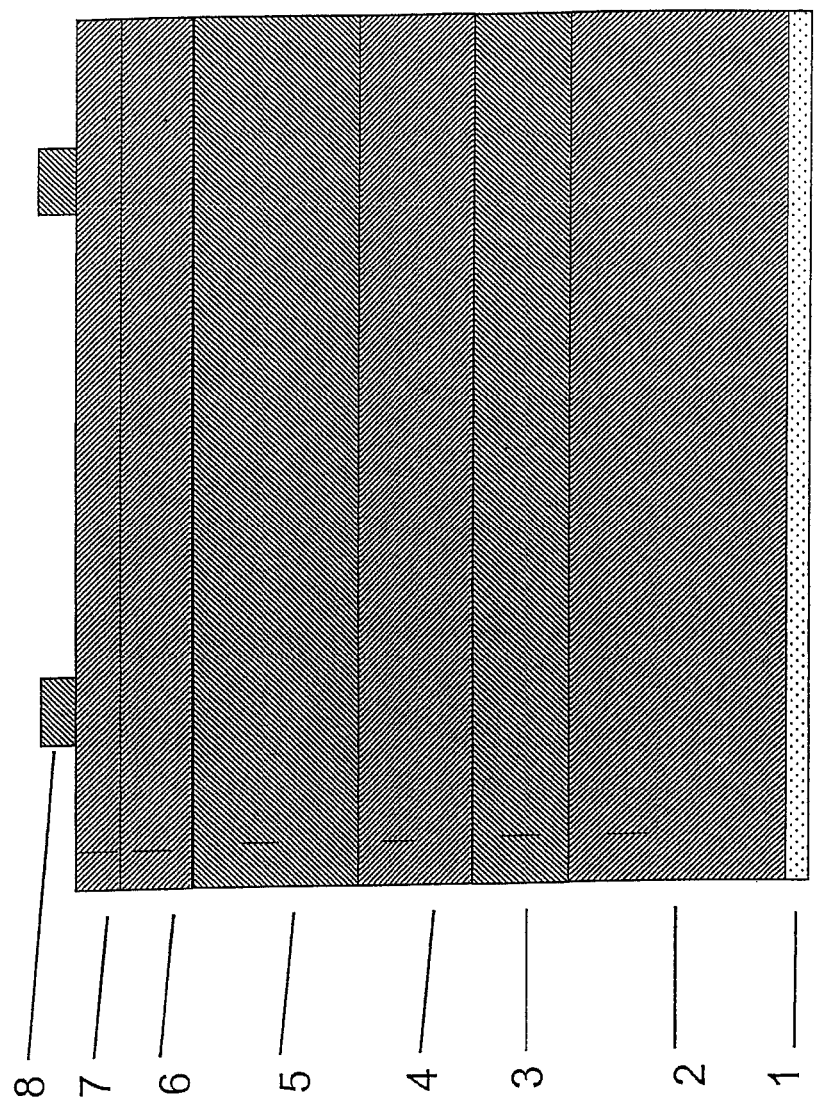
FIG. 1 shows, in a schematic representation, the construction of a silicon thin layer solar cell known from prior art.

In FIG. 1, a silicon thin layer solar cell known from prior art is represented, which is based on a substrate 2 provided with a base contact 1 on the rear side. An intermediate layer 3 which is covered in turn by nucleus layer 4 is disposed on the substrate. The nucleus layer concerns a recrystallised and highly doped silicon layer. An absorber layer 5 which is doped normally is deposited in turn on the nucleus layer. The layer system is concluded by an emitter layer 6 and an anti-reflection or passivation layer 7. An emitter contact 8 is then also applied on this layer stack.

Figure 2:
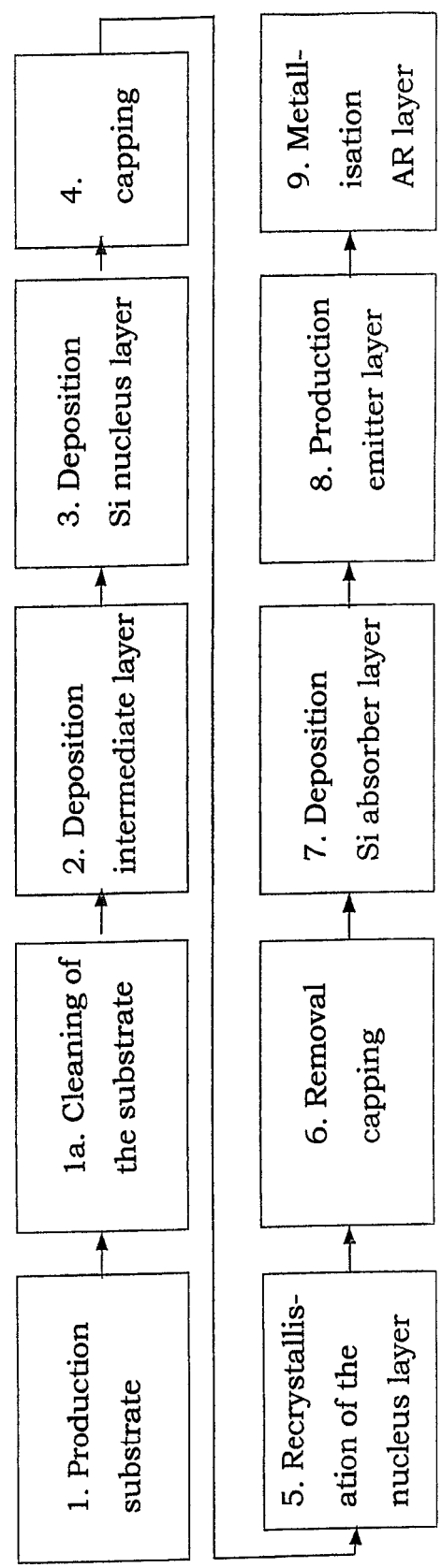
FIG. 2 shows, with reference to a flow chart, the process course for the production of recrystallised silicon thin layer solar cells.

FIG. 2 shows schematically the course of the production method for the layer system represented in FIG. 1. The essential core of one or more embodiments of the invention hereby relates to the step 5 of recrystallisation of the nucleus layer which is implemented according to the zone melting method.

Figure 3:
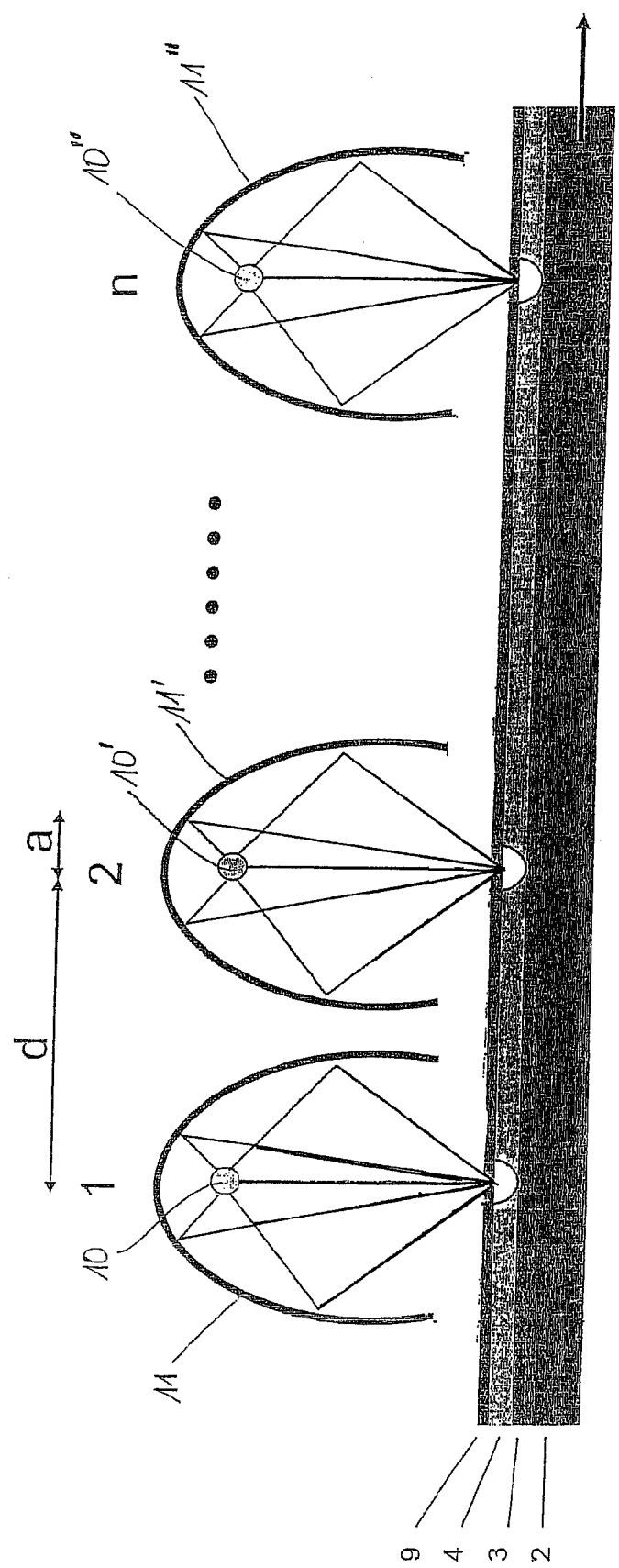
FIG. 3 shows a sectional drawing of the device according to the invention.

FIG. 3 shows schematically the method implementation according to the invention in which a cascade of heat sources 10, 10', 10" is used in the device. The entire cascade comprises up to n heat sources. The individual heat sources are surrounded by associated focusing mirrors 11, 11' and 11" with which the heat radiation is focused onto the layer structure. The layer structure hereby again comprises a substrate 2, an intermediate layer 3 and also the nucleus layer 4 to be recrystallised. The latter is covered by an optional cover layer 9. The spacing between the individual heat sources is indicated here with a length d, the transport during the melting phase being continued again by a further stretch section a in order to ensure overlapping of the melting zones.

Figure 4:
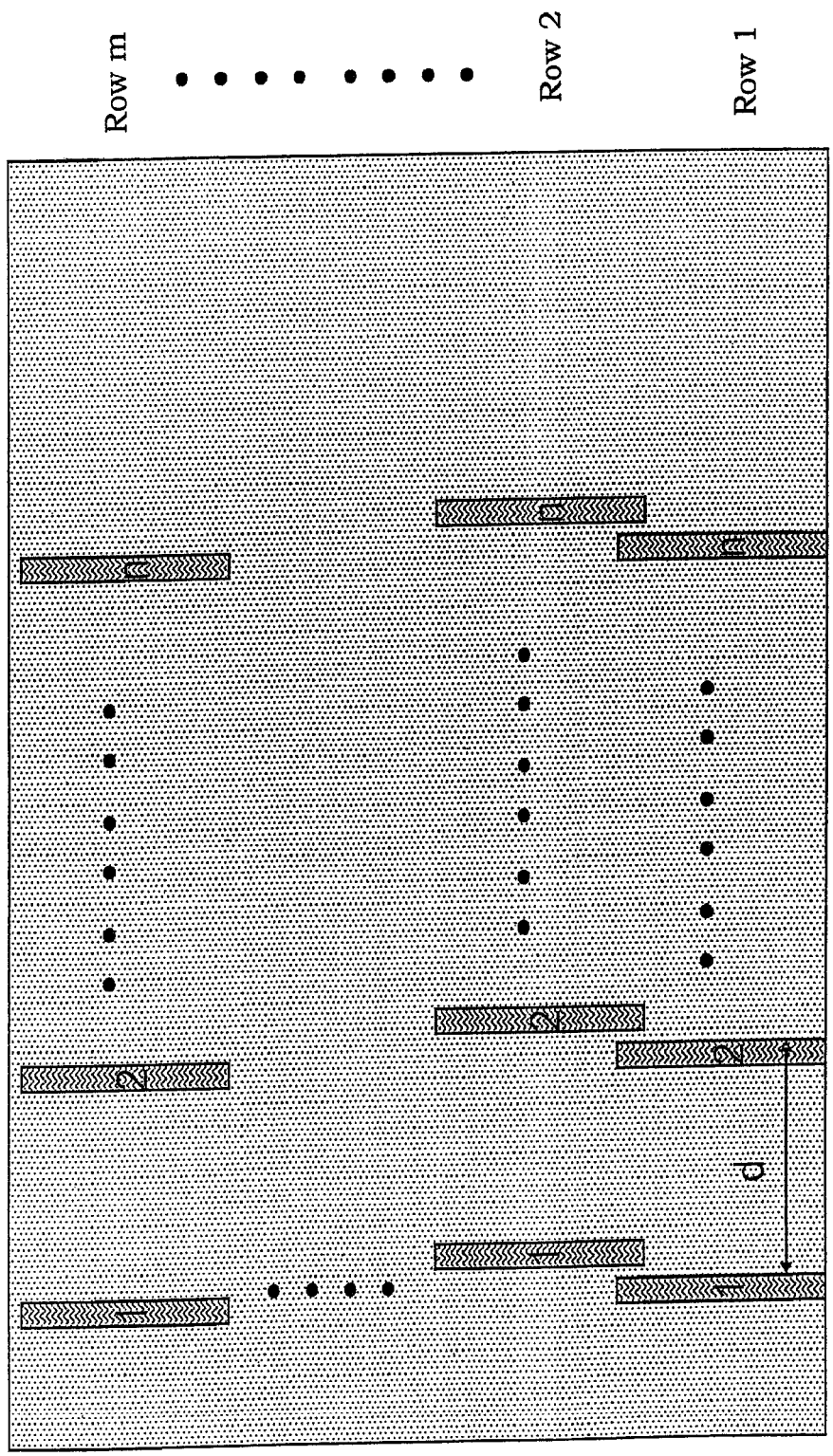
FIG. 4 shows, with reference to a schematic representation, a variant according to the invention with a corresponding array-like arrangement of the heat sources.

FIG. 4 shows a particularly preferred variant of the method according to the invention. The individual heat sources are hereby disposed both adjacently and successively, which leads to an array-like arrangement. Because of the indicated offset of the heat sources in the various rows, the result is an overlap of the "melting rows". Within each individual row, n heat sources are disposed in turn, the melting zones produced by these heat sources also overlapping. The throughput of the zone melting process can be increased again by this array-like arrangement.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of re-crystallization of a layer structure by means of zone melting, comprising:
producing a plurality of linear meting zones using at least two heat sources; and
producing relative movement of the heat sources relative to the layer structure such that: (i) the linear melting zones are drawn through the layer structure in a direction perpendicular to the linear melting zones, (ii) the linear melting zones are drawn simultaneously through the entire layer structure with an overlap in regions of the linear melting zones with already re-crystallized zones so that a continuous re-crystallization of the layer structure is ensured, wherein:
a) in a first phase (melting phase), the at least two melting zones, in the direction perpendicular to the linear melting zones, are drawn through the layer structure simultaneously over a first stretch d+a and at a speed which enables a high crystal quality, d representing the spacing of two adjacent heat sources and a<d,
b) the layer structure, in a second phase (transport phase), is moved over a second stretch $(n-1) \cdot d - b$ which is subsequent to the first stretch in the direction perpendicular to the linear melting zones and at a speed which is increased relative to the first phase, in which the layer structure is not melted, n representing the number of successively disposed heat sources and b being chosen such that the result is an overlap of the melting zones with the already re-crystallized zones, and
steps a) and b) being repeated until there is continuous re-crystallization of the layer structure.

2. The method according to claim 1, wherein the relative movement is made possible by transport of the layer structure.

3. The method according to claim 1, wherein the relative movement is made possible by transport of the at least two heat sources.

4. The method according to claim 1, wherein the linear melting zones, in the direction perpendicular to the linear melting zones, overlap in regions with already re-crystallized zones.

5. The method according to claim 1, wherein the at least two heat sources, in the direction perpendicular to the linear melting zones, are disposed one behind the other with the same spacing between adjacent heat sources.

6. A method of re-crystallization of a layer structure by means of zone melting, comprising:
producing a plurality of linear melting zones using at least two heat sources; and
producing relative movement of the heat sources relative to the layer structure such that: (i) the linear melting zones are drawn through the layer structure in a direction perpendicular to the linear melting zones, (ii) the linear melting zones are drawn simultaneously through the entire layer structure with an overlap in regions of the linear melting zones with already re-crystallized zones so that a continuous re-crystallization of the layer structure is ensured, wherein:
a) in a first phase (melting phase), the at least two heat sources, in the direction perpendicular to the linear melting zones, are moved simultaneously over a first stretch d+a and at a speed which enables a high crystal quality, d representing the spacing of two adjacent heat sources and a<d, and
b) the heat sources in a second phase (transport phase) are moved over a stretch −(d+a) and the layer structure is moved over a stretch n*d+a−b in the opposite direction thereto and at a speed which is increased relative to the first phase, in which the layer structure is not melted, n representing the number of successively disposed heat sources and b being chosen such that the result is an overlap of the melting zones with the already re-crystallized zones, and
steps a) and b) being repeated until there is continuous re-crystallization of the layer structure.

7. A method of re-crystallization of a layer structure by means of zone melting, comprising:
producing a plurality of linear melting zones using at least two heat sources; and
producing relative movement of the heat sources relative to the layer structure such that: (i) the linear melting zones are drawn through the layer structure in a direction perpendicular to the linear melting zones, (ii) the linear melting zones are drawn simultaneously through the entire layer structure with an overlap in regions of the linear melting zones with already re-crystallized zones so that a continuous re-crystallization of the layer structure is ensured, wherein:
a) in a first melting phase, the at least two linear melting zones, in the direction perpendicular to the linear melting zones, are drawn through the layer structure simultaneously over a first stretch d+a and at a speed which enables a high crystal quality, d representing the spacing of two adjacent heat sources and a<d,
b) the heat sources and/or the layer, in a second phase (transport phase), are moved over a second stretch n*d+a−b which is subsequent to the first stretch in the direction perpendicular to the linear melting zones and at a speed which is increased relative to the first phase, in which the layer is not melted, n representing the number of successively disposed heat sources and b being chosen such that the result is an overlap of the melting zones with the already re-crystallized zones,
c) in a second melting phase, the at least two melting zones, in the direction perpendicular to the linear melting zones, are drawn through the layer structure simultaneously over a stretch −(d+a) and at a speed which enables a high crystal quality, d representing the spacing of two adjacent heat sources and a−d and
d) in a second transport phase, the heat sources and/or the layer structure are moved over a second stretch n*d+a−b which is subsequent to the first stretch in the direction perpendicular to the linear melting zones and at a speed which is increased relative to the first phase, in which the layer is not melted, n representing the number of successively disposed heat sources and b being chosen such that the result is an overlap of the melting zones with the already re-crystallized zones, and
steps a), b), c) and d) being repeated until there is continuous re-crystallization of the layer.

8. The method according to claim 1, wherein the temperature of the heat sources is reduced in the transport phase.

9. The method according to claim 1, wherein the heat sources in the transport phase are moved at a speed which is higher by a factor in the range of 2 to 100 than in a).

10. The method according to claim 1, wherein the heat sources, in the direction perpendicular to the linear melting zones, are disposed adjacently, the adjacently disposed heat sources having an offset relative to each other respectively in the direction perpendicular to the linear melting zones so that the melting zones produced by the heat sources overlap in regions.

11. The method according to claim 1, wherein the heat sources are selected independently of each other from the group consisting of: electron beam heaters, laser beam sources, graphite strip heaters, halogen lamp heaters, IR radiators and UV radiators.

12. The method according to claim 1, wherein the layer structure is connected to a substrate.

13. The method according to claim 12, wherein the heat sources are disposed independently of each other on a front side and/or on a rear side towards a surface of the layer structure and/or of the substrate.

14. The method according to claim 1, wherein the layer structure includes a crystalline silicon thin layer for the production of crystalline silicon thin layer solar cells.

15. The method according to claim 1, wherein the layer structure includes a thin semiconductor layer for use in SOI technology.

16. The method according to claim 1, wherein the layer structure includes metals, plastic materials or adhesives.

* * * * *